United States Patent [19]

Nickola et al.

[11] Patent Number: 4,517,229
[45] Date of Patent: May 14, 1985

[54] DIFFUSION TREATED HOT-DIP ALUMINUM COATED STEEL AND METHOD OF TREATING

[75] Inventors: Richard A. Nickola, Highland; Shashi B. Agarwal, Griffith, both of Ind.

[73] Assignee: Inland Steel Company, Chicago, Ill.

[21] Appl. No.: 511,568

[22] Filed: Jul. 7, 1983

[51] Int. Cl.$^3$ .............................................. B05D 3/02
[52] U.S. Cl. .................................. 427/383.9; 428/653
[58] Field of Search ...................... 428/653; 421/383.9

[56] References Cited

U.S. PATENT DOCUMENTS

| | | | |
|---|---|---|---|
| 2,697,869 | 12/1954 | Kingston | 428/653 |
| 2,752,265 | 6/1956 | Whitfield | 427/383.9 |
| 3,059,326 | 10/1962 | Jominy et al. | |
| 3,134,685 | 5/1964 | Dravnieks | |
| 3,305,384 | 2/1967 | Kenderi | 428/653 |
| 3,881,880 | 5/1975 | Gomersall | |
| 3,973,918 | 8/1976 | Tidwell | 428/653 |

FOREIGN PATENT DOCUMENTS

| | | | |
|---|---|---|---|
| 1391659 | 2/1965 | France | |
| 102556 | 8/1981 | Japan | 428/653 |

OTHER PUBLICATIONS

Drewett, Anti-Corrosion, pp. 11–16, Apr. 1969.
Morgan, Metal Progress, pp. 126–128.

*Primary Examiner*—Sam Silverberg
*Attorney, Agent, or Firm*—Marshall, O'Toole, Gerstein, Murray & Bicknell

[57] ABSTRACT

A solid solution iron-aluminum diffusion alloy coated steel strip is formed by hot-dip aluminum coating a cold rolled low alloy low carbon steel strip preferably having all the carbon in the steel combined with titanium by hot-dip aluminum coating the steel strip and subjecting the aluminum coated low alloy steel strip to a controlled diffusion heat treatment in a non-oxidizing atmosphere for a period and at a temperature which avoids significantly increasing the grain size of the steel, and which effects diffusion of the hot-dip aluminum coating into the steel to establish a critical surface concentration of aluminum in the iron-aluminum diffusion alloy coating of at least about 8 wt. percent and below an aluminum surface concentration which results in crazing and cracking of the diffusion alloy coating when the diffusion alloy coated strip is fabricated at room temperature. A solid solution iron-aluminum diffusion alloy coated titanium containing low carbon steel strip having an aluminum surface concentration between about 8 and about 10 wt. percent does not exhibit objectionable crazing and cracking of the diffusion alloy coating when the coated steel is severely strained during fabrication at room temperature and has good high temperature oxidation resistance when the diffusion alloy coated steel strip is exposed to oxidizing gasses having temperatures between about 816° C. (1500° F.) and 982° C. (1800° F.) after being severely strained at room temperature.

6 Claims, 7 Drawing Figures

DIFFUSION TREATED HOT-DIP ALUMINUM COATED STEEL AND METHOD OF TREATING

The present invention relates generally to an aluminum coated ferrous metal article having improved high temperature oxidation resistance, and more particularly to a method of providing an improved aluminum coated steel strip which is resistant to oxidation when exposed to an oxidizing atmosphere at an elevated temperature after the strip has been severely deformed at room temperature.

Catalytic converters which are used in the exhaust systems of motor vehicles must be resistant to oxidation when exposed to oxidizing gases having temperatures generally between about 816° C. (1500° F.) and about 982° C. (1800° F.). Large scale production of catalytic converters has created a need for an inexpensive steel sheet metal material which is formable at room temperature by conventional procedures, has good high temperature oxidation resistance after being fabricated at room temperature, is resistant to corrosion by sulfurous gases and has good high temperature strength for long-term stability. In view of the limited availability and the relatively high cost of many of the more effective protective alloy metals, such as chromium and nickel, however, the production of corrosion resistant and high temperature oxidation resistant ferrous metal sheet materials which use substantial amounts of critical protective metals has become very expensive. For this reason, a great deal of effort and thought have been given to developing ferrous metal alloys and protective coatings for ferrous metal strips having high temperature oxidation resistance and strength which do not require using large amounts of expensive alloy metals or special processing conditions and equipment not conventionally used.

Hot-dip aluminum coatings have been extensively used on steel strip material to impart corrosion and oxidation resistance to a ferrous metal base, such as a low carbon steel strip. And, while hot-dip aluminum coated low carbon steel strips are relatively inexpensive and readily formable at room temperature, the oxidation resistance of a Type I aluminum-silicon hot-dip aluminum coated low carbon steel strip does not exceed about 677° C. (1250° F.) and is significantly lower after the coated strip has been significantly deformed. Thus, when such a hot-dip aluminum coated low carbon steel is formed into a converter shell and exposed to motor vehicle exhaust gasses having a temperature above 677° C. (1250° F.), the aluminum coating flakes off and exposes the steel to damaging oxidation.

The high temperature oxidation resistance of a hot-dip aluminum coated ferrous metal strip is substantially improved by applying the hot-dip aluminum coating to a low titanium alloy low carbon ferrous metal strip (U.S. Pat. No. 3,881,880; Gomersall). However, it has been found that crazing or cracking take place when the coated sheet material is subjected to only mild strain at room temperature (i.e. strain in excess of about 5 percent), and highly objectionable oxidation occurs in the strained areas when the aluminum coated steel is exposed for an extended period to an oxidizing atmosphere at an elevated temperature (See dark area in FIG. 1). When the prior art Gomersall aluminum coated titanium-containing steel is subjected to strain at room temperature by fabricating into a motor vehicle converter shell and thereafter exposed to a high temperature oxidizing atmosphere, the oxidation resistance of the aluminum coated steel is not satisfactory at metal strip temperatures above about 538° C. (1000° F.).

Another aluminum coated steel product which provides good high temperature oxidation resistance without using critical alloy metals requires forming on the surface of a fabricated aluminum alloy core or base a coating composed of iron-aluminum intermetallic compounds containing from 20 to 50 wt. percent aluminum (U.S. Pat. No. 3,059,326; Jominy et al). However, the Jominy et al process requires applying a metallic aluminum surface coating to a special base consisting of an iron-aluminum alloy steel containing a minimum of about 3.0 wt. percent aluminum and up to about 12 wt. percent aluminum. When the iron-aluminum alloy steel base contains as much as 8 wt. percent aluminum, Jominy et al teach it is necessary to employ vacuum degassing or use other special metal processing conditions to enable the iron-aluminum alloy base to be deformed during fabrication without first heating the base to an elevated temperature. An even more serious objection to the Jominy et al product and process is the inability to fabricate at room temperature the coated product having the surface coating of iron-aluminum intermetallic compounds, because the surface coating of iron-aluminum intermetallic compounds has no appreciable ductility at room temperature. Thus, the Jominy et al iron-aluminum alloy base must be fabricated into its desired final configuration, such as into a catalytic converter shell, and thereafter form the surface coating of iron-aluminum intermetallic compounds on the fabricated iron-aluminum alloy steel base.

Aluminum coated steel sheets have also been used to make homogenous sheets of iron-aluminum alloy steel material (French Pat. No. 1,391,659), because it is practically impossible to forge or roll at room temperature an iron-aluminum alloy containing as much as 8 wt. percent aluminum when cast as an alloy. Sheets of iron-aluminum alloy containing between 8 and 30 wt. percent aluminum are produced according to the aforementioned French patent by applying to the surface of a ferrous metal sheet a thick coating of metallic aluminum sufficiently heavy to supply all the aluminum required to form a homogenous iron-aluminum alloy sheet containing between 8 and 30 wt. % aluminum and heating the aluminum coated sheet at an elevated temperature between 850° C. (1562° F.) and 1250° C. (2282° F.) until the aluminum has been uniformly diffused throughout the steel sheet to form the homogenous aluminum alloy sheet. The resulting iron-aluminum alloy sheet is not formable at room temperature, however, and must be heated to at least 600° C. (1112° F.) in order to permit fabrication.

It is therefore an object of the present invention to provide in an economical manner an improved hot-dip aluminum coated ferrous metal strip having good high temperature oxidation resistance after severe deformation at room temperature and a method of producing the improved hot-dip aluminum coated strip.

It is a further object of the present invention to provide in an economical manner an improved hot-dip aluminum coated low carbon steel strip having improved room temperature formability properties and good high temperature oxidation resistance after severe deformation at room temperature and a method of producing the improved hot-dip aluminum coated strip.

It is still another object of the present invention to provide an economical process for producing a low alloy low carbon steel strip with an iron-aluminum diffusion alloy coating having a surface concentration of at least 8 wt. percent aluminum which is resistant to oxidation when exposed to a high temperature oxidizing atmosphere, such as motor vehicle exhaust gasses having temperatures between about 816° C. (1500° F.) and about 982° C. (1800° F.), after being severely strained at room temperature.

Other objects of the present invention will be apparent to those skilled in the art from the detailed description and claims to follow when read in conjunction with the accompanying graphs, photographs and photomicrographs comprising the drawing wherein:

A coated ferrous metal article which overcomes the room temperature formability and high temperature oxidation resistance deficiencies of prior hot-dip aluminum coated low carbon steel products can be provided in an economical manner by applying the hot-dip aluminum coating (i.e. either a hot-dip (Type I) aluminum-silicon coating or a hot-dip (Type II) metallic aluminum coating) to a surface of a low carbon steel base, preferably in the form of a titanium containing low carbon steel strip, and diffusion heating the hot-dip coated strip under controlled processing conditions which provide a surface layer or coating consisting of a solid solution iron-aluminum diffusion alloy or iron-aluminum-silicon diffusion alloy which has an aluminum surface concentration of at least about 8 wt. percent aluminum, and preferably having an aluminum surface concentration between about 8 and about 10 wt. percent aluminum. The diffusion coating is directly bonded to the steel strip without forming any intervening subsurface layer or inclusions visible at 250× magnification.

The ferrous metal base which is hot-dip aluminum coated preferably is a low alloy steel containing a small amount of titanium and can be a cold rolled low carbon steel strip, and preferably but not necessarily an aluminum killed steel, having a carbon content below about 0.25 weight percent and generally having between about 0.001 weight percent carbon to about 0.1 weight percent carbon. The low allow steel will generally contain between 0.01 and 1.0 wt. percent titanium. An aluminum killed low carbon steel which can be used in the present invention will generally contain between about 0.01 to 0.08 weight percent carbon, about 0.2 to 0.8 weight percent manganese, a maximum of about 0.03 weight percent sulfur, a maximum of about 0.015 weight percent phosphorus, about 0.05 weight percent silicon, a maximum of about 0.10 weight percent aluminum, and the balance being essentially iron with the usual amounts of residual impurities. If the steel is a vacuum degassed steel, the concentration of all metalloids and residuals in the steel are maintained at a very low level. A typical low-carbon aluminum killed steel to which the titanium is added in the steel making process has the following approximate composition on a weight basis: Carbon 0.04 percent, Manganese 0.25–0.50 percent, Sulfur 0.030 percent, Phosphorous 0.02 percent, Silicon 0.05 percent, Aluminum 0.020 to 0.090 percent, and the balance essentially iron and incidental impurities.

Titanium should be included in the low carbon steel which is hot-dip aluminum coated wherever the diffusion alloy coated steel strip will be severely strained at room temperature during fabrication and thereafter is exposed to an oxidizing atmosphere having a temperature in excess of 816° C. (1500° F.) which is sufficient to raise the skin temperature of the coated strip substantially above 538° C. (1000° F.). The titanium which is added to a low carbon steel combines with all the carbon in the steel to form titanium carbides which, in addition to stabilizing the carbon in the steel, significantly improves the high temperature strength of the coated steel product. In order that the steel have sufficient titanium carbide for good high temperature strength the steel preferably should contain in excess of about 0.02 wt. percent carbon. The titanium also combines with any uncombined nitrogen and oxygen in the steel, but as the latter elements are present in only very small amounts in a low carbon steel, the titanium required to combine with the nitrogen and oxygen will generally not be significant. The low carbon steel should have a titanium content at least 4 times the carbon content of the steel in order to have sufficient titanium to combine with all the carbon in the steel but can have as much as 10 times the wt. percent carbon in the steel. It is also preferred but not required that the steel have a small excess of uncombined titanium (i.e. about 0.1 to 0.3 wt. percent titanium in excess of the amount required to combine with all the carbon). As the carbon content of the steel used in the present invention is relatively small and generally less than 0.1 percent by wt. carbon, the total amount of titanium required is small and generally substantially less than about 1.0 wt. percent titanium. An amount of titanium greater than the foregoing gives no increased benefit and merely adds to the cost of the steel.

Although titanium is an essential alloying element to be added to the low carbon steel in the preferred embodiment of the invention where both improved room temperature deformation and high temperature oxidation resistance is required, it is also within the scope of the invention to add small amounts of other metallic alloying elements, such as molybdenum or columbium, to improve the physical properties of the base steel. However, the secondary alloying elements should not be present in an amount which impairs the oxidation resistance of the steel, and the total amount of the secondary alloying elements should not exceed about 2 percent by weight of the steel. Thus, the base steel of the present invention is in every instance a low alloy low carbon steel.

The hot-dip aluminum coating which is applied to the low alloy low carbon steel strip can be formed of a pure aluminum (Type II) coating or an aluminum rich alloy coating, such as an aluminum (Type I) coating which contains between about 5 and 12 percent by weight silicon. In producing the improved iron-aluminum diffusion alloy coated strip of the present invention, however, it is not essential to include silicon in the aluminum hot-dip coating bath in order to prevent forming an objectionably thick subsurface layer of intermetallic iron-aluminum compounds during the hot-dip coating procedure, as any such layer is dissipated during the diffusion heat treatment. The hot-dip aluminum coatings can be applied by the hot-dip coating process known as a Sendzimir type process and by any of the known modifications thereof or by any conventional hot-dip coating process.

The improved solid solution iron-aluminum diffusion alloy coating is formed by subjecting the hot-dip aluminum coated low carbon steel strip preferably containing a small amount of titanium to a controlled diffusion heat treatment which transforms the hot-dip metallic aluminum coating into a solid solution iron-aluminum diffusion alloy layer or coating having a critical aluminum surface concentration of at least 8 wt. percent, and preferably between about 8 and about 10 wt. percent aluminum, with the iron-aluminum alloy diffusion coating being directly bonded to the steel strip without having an intervening subsurface intermetallic layer or forming any other interface layer or inclusions which are visible at 250× magnification. The diffusion heat treatment must provide a solid solution iron-aluminum diffusion alloy coating having an aluminum surface concentration of at least about 8 wt. percent aluminum in order to provide the diffusion alloy coated strip with good high temperature oxidation resistance after the strip has been severely strained during fabrication at room temperature and the strip thereafter is exposed for a prolonged period to oxidizing gasses having an elevated temperature, such as in the exhaust system of a motor vehicle.

The ductility or formability of a low titanium alloy low carbon steel strip having a solid solution iron-aluminum diffusion alloy surface coating or layer has been found to be synergistically dependent upon the ductility of both the solid solution iron-aluminum diffusion alloy coating and the base steel. Therefore, optimum ductility must be provided in both the steel base and the diffusion alloy surface coating in order to produce a diffusion alloy coated steel strip having an aluminum surface concentration of about 8 to about 10 wt. percent which can be severely deformed or strained at room temperature and still exhibit good high temperature oxidation resistance when exposed to an oxidizing atmosphere having a temperature of 816° C. (1500° F.) and up to about 982° C. (1800° F.).

In order to maintain optimum ductility in the steel base and ultimately in the diffusion coated product, the heat treatment used for diffusing the hot-dip aluminum coating into the steel base must avoid significantly increasing the grain size of the steel base. Grain size measurements of several panels of cold rolled low titanium alloy aluminum-killed low carbon steel of the type preferably used in the present invention were determined by the linear intercept method after heating the steel panels for several specified times and temperatures in a batch annealing furnace under a non-oxidizing atmosphere, and the results are shown in the following Table I:

TABLE I

| Grain Size of Diffusion Annealed Ti-Bearing Steel | | |
|---|---|---|
| Heating Temp. | Heating Time, Hours | ASTM Grain Size* |
| 816° C. | 30 | #10 |
|  | 40 | 10 |
|  | 50 | 10 |
| 871° C. | 5 | 9 |
|  | 15 | 9 |
| 927° C. | 5 | 8 |
|  | 15 | 7 |

*The Smaller The Numerical Values The Larger The Grain Size

The panels which were treated for up to 50 hours at 816° C. (1500° F.) did not show any increase in grain size. Significant grain growth was produced, however, when the low titanium alloy steel base was heated for 15 and 5 hours at 927° C. (1700° F.). Thus, where the coated steel strip must have good room temperature formability, the optimum diffusion heating temperature is about 816° C. (1500° F.) when diffusion heating the hot-dip aluminum coated strip for a period of between about 30 and 50 hours. When optimum formability is not required a higher diffusion heating temperature than 816° C. can be used.

Figure 2:
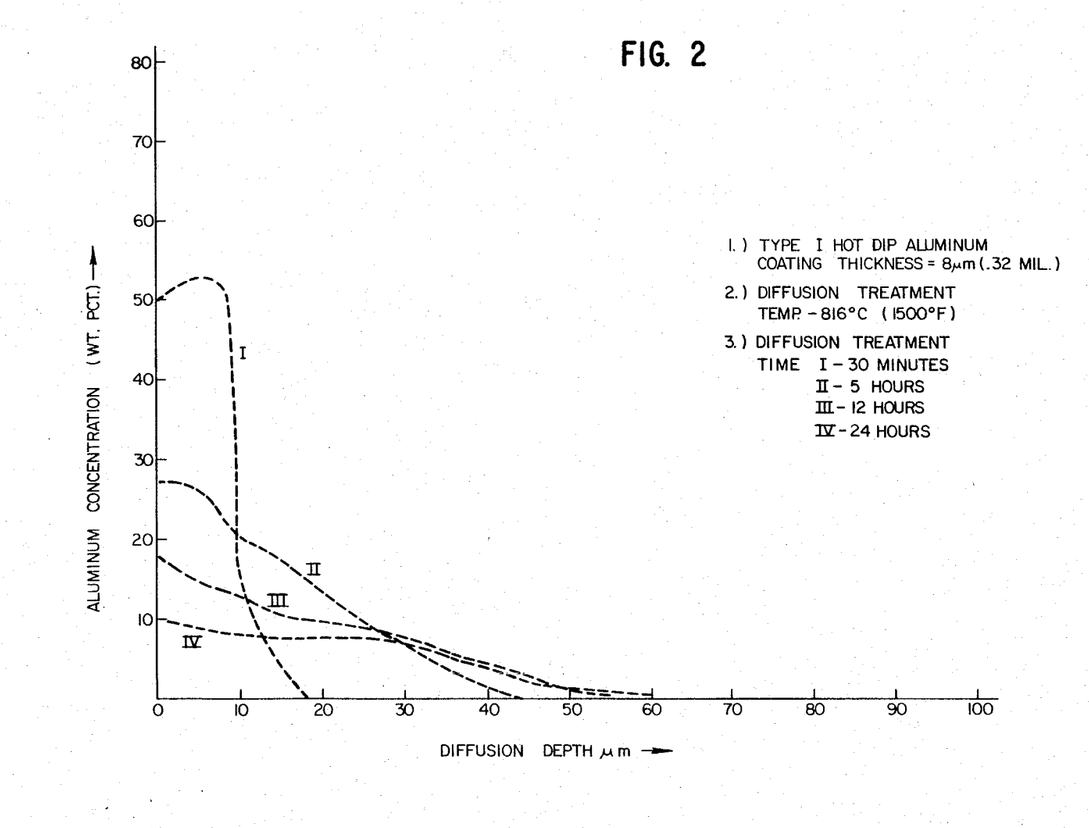
FIG. 2 is a graph showing the surface concentration and distribution of aluminum in an iron-aluminum diffusion alloy coated titanium-containing aluminum killed low carbon steel strip produced by diffusion heat treating the hot-dip Type I aluminum coated steel strip for different periods of time at 816° C. (1500° F.)

The concentration of aluminum in a solid solution iron-aluminum diffusion alloy has an important and critical effect on the ductility and room temperature formability of the diffusion coated steel, as well as on the high temperature oxidation resistance of the diffusion alloy coating. An important factor in determining the surface concentration of aluminum in a diffusion alloy surface coating is the temperature and duration of the diffusion heat treatment to which the hot-dip aluminum coated strip is subjected. For example, when panels of a low titanium alloy aluminum killed low carbon steel were provided with a hot-dip aluminum (Type I) coating having a thickness of 17.5 μm (0.7 mil) according to the procedure disclosed in the specific example set forth herein and heated in a non-oxidized atmosphere at a temperature of 816° C. (1500° F.) for a period of 30 and 40 hours, the surface concentration of aluminum in the solid solution iron-aluminum diffusion alloy coating formed was about 9 wt. percent aluminum in the panels heated for 40 hours and was about 10 wt.

percent aluminum in the panels heated for 30 hours. The silicon content in the surface of each of the foregoing diffusion coatings was about 2 wt. percent. When the hot-dip aluminum coating had a thickness of only about 8 μm (0.32 mil), diffusion heating the relatively thin aluminum coating at 816° C. (1500° F.) for 24 hours provided an aluminum surface concentration of 10 wt. percent, with substantially higher surface concentrations of aluminum resulting when heat treating at the same temperature for a period of 12 hours and below (See FIG. 2). The term "surface concentration" of aluminum in the diffusion alloy coatings in each instance designates the concentration of aluminum (wt. percent) at a point about 2.5 microns below the surface of the diffusion alloy coating based on electron probe microanalysis data. The outermost surface of an iron-aluminum diffusion alloy coating is formed of a thin layer of aluminum oxide.

Figure 3:
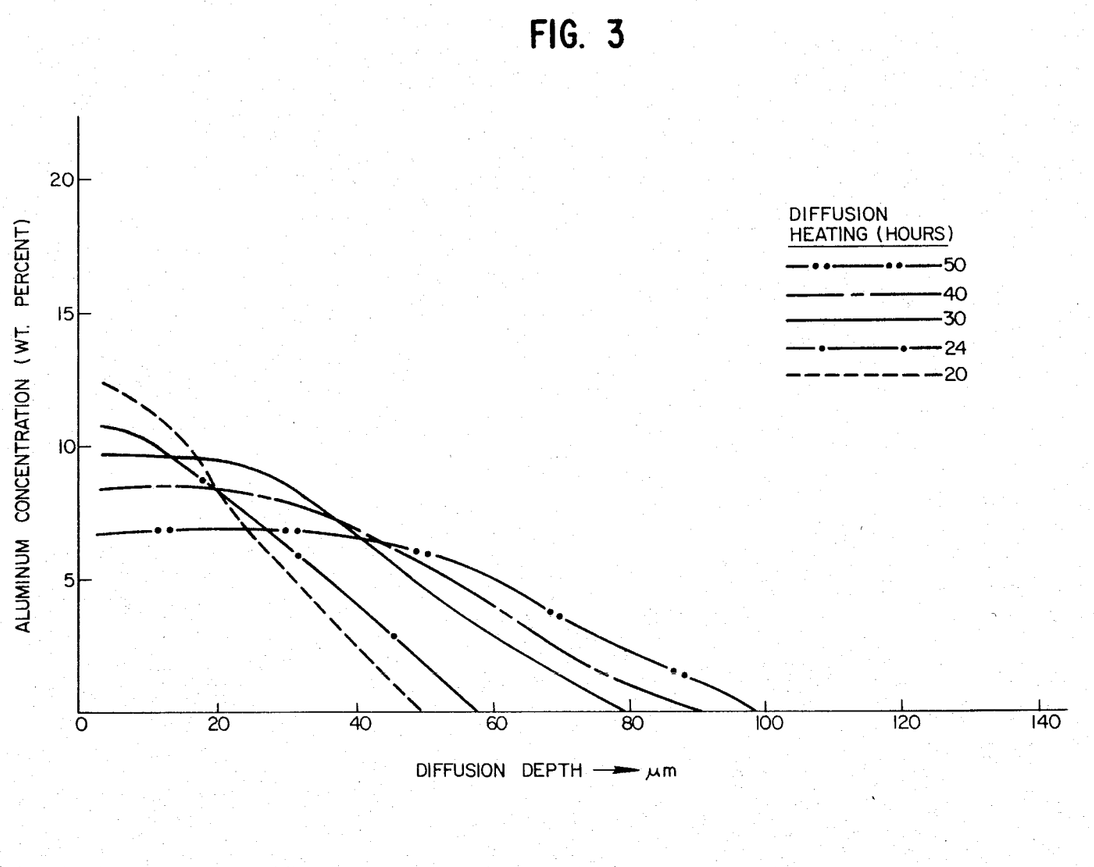
FIG. 3 is a graph showing the surface concentration and distribution of aluminum in an iron-aluminum diffusion alloy coated titanium-containing aluminum killed low carbon steel strip produced by diffusion heat treating the hot-dip Type I aluminum coated steel strip for different periods of time at 816° C. (1500° F.) where the hot-dip aluminum coating thickness is twice as thick (16 $\mu$m) as the hot-dip coating in FIG. 2.

Ductility measurements were made on several titanium-containing aluminum killed low carbon steel panels each provided with an iron-aluminum diffusion alloy coating having different surface concentrations of aluminum. These diffusion alloy coated panels were made from a low carbon steel strip having a Type I aluminum hot-dip coating (i.e. aluminum containing about 11 wt. percent silicon) with a coating thickness about 16 μm (0.64 mil) and diffusion heating the panels in a non-oxidizing atmosphere at 816° C. (1500° F.) for 20, 24, 30, 40 and 50 hours and the distribution of aluminum in the diffusion coating determined by electron probe analysis (See FIG. 3). The "surface concentration" of aluminum in each of the diffusion alloy coating is the wt. percent aluminum found at a depth of about 2.5 microns and the results are shown in the following Table II:

TABLE II

| Panel | Heating Time | Aluminum Surface Concentration (Wt. Percent) |
|---|---|---|
| A | 20 hours | 12.8 |
| B | 24 hours | 10.7 |
| C | 30 hours | 9.5 |
| D | 40 hours | 8.4 |
| E | 50 hours | 6.7 |

The room temperature ductility of each of the foregoing panels were determined by means of the 7.62 mm (0.3 inch) Olsen Button Coating Thickness Formability Tester. The panels having an aluminum surface concentration between about 8 wt. percent and about 10 wt. percent, respectively, showed only slight crazing or cracking of the diffusion coating in areas of maximum strain (i.e. in excess of 30 percent strain), while the panel with an aluminum surface concentration significantly greater than 10 wt. percent exhibited extensive cracking and crazing after deformation at room temperature and are readily oxidized when exposed to a high temperature oxidizing atmosphere. Thus, the surface concentration of aluminum in a solid solution iron-aluminum-silicon diffusion alloy coating (or iron-aluminum diffusion alloy coating) should be maintained between about 8 and about 10 percent by wt. where optimum formability at room temperature is desired in the iron-aluminum diffusion alloy coated steel strip and the coated strip thereafter must be exposed to an oxidizing atmosphere at temperatures between about 677° C. (1250° F.) and about 982° C. (1800° F.). When the surface concentration of aluminum in the diffusion alloy coating is significantly below about 8 wt. percent aluminum, the diffusion alloy coated strip is formable at room temperature, but the oxidation resistance of the diffusion alloy coated strip is not sufficient to withstand exposure in an oxidizing atmosphere at elevated temperatures between about 816° C. (1500° F.) and about 982° C. (1800° F.). Where good room temperature formability is not required, as when it is not necessary to subject the coated strip to severe deformation at room temperature during fabrication, the solid solution iron-aluminum diffusion alloy coating can have a surface concentration of aluminum somewhat greater than about 10 wt. percent aluminum.

The thickness of the solid solution iron-aluminum diffusion alloy coating having a surface concentration of between about 8 and 10 wt. % aluminum formed on the surface of a low-carbon steel strip also has a significant affect on the room temperature formability of the diffusion alloy coated strip. Thus, it is preferred that the hot-dip aluminum coating (Type I or Type II) have a thickness of at least 8 μm but not substantially in excess of about 37 μm.

The preferred diffusion heat treating conditions for providing an improved solid solution iron-aluminum diffusion alloy coating on a low alloy low carbon steel strip having a hot-dip aluminum (Type I or Type II) coating with a thickness of between about 8 μm and 25 μm which provides the herein described solid solution iron-aluminum or iron-aluminum-silicon diffusion alloy coating comprise heating the hot-dip aluminum coated steel strip in open coil (or in tight wound coil) form at a temperature of about 816° C. (1500° F.) in a batch annealing chamber provided with a non-oxidizing atmosphere, such as a nitrogen atmosphere or an atmosphere of 5% hydrogen-95% nitrogen, for between about 24 and 50 hours and preferably between about 30 and 40 hours where the coatings have a thickness of between about 17 μm and 20 μm. It should be understood, however, that a continuous diffusion heat treatment may be used instead of the controlled batch-type diffusion heating in which case the hot-dip coated strip could be heated on a continuous annealing line.

Figure 1:
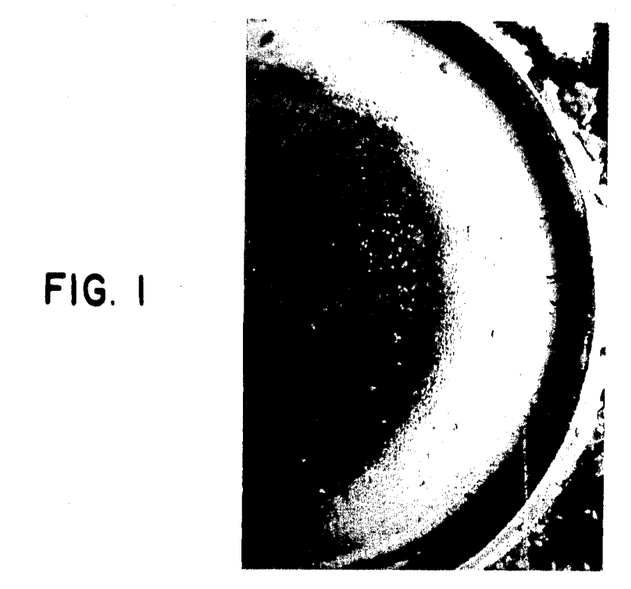
FIG. 1 is a photograph of the surface oxidation produced in a titanium containing aluminum killed low carbon steel panel having a hot-dip metallic aluminum (Type I) surface coating after being severely strained by forming a bulge therein at room temperature in a Bulge Tester and heated in air at a temperature of 816° C. (1500° F.) for a period of about 420 hours.
Figure 4:
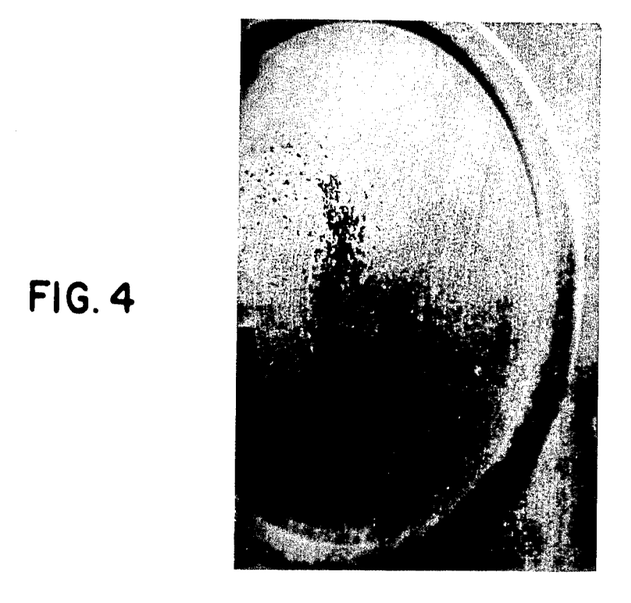
FIG. 4 is a photograph of the oxidation produced by heating in air at a temperature of 816° C. (1500° F.) for a period of about 500 hours a low titanium alloy aluminum killed low carbon steel panel having a solid solution iron-aluminum-silicon diffusion alloy coating after the coated panel was deformed in a Bulge Tester.
Figure 5:
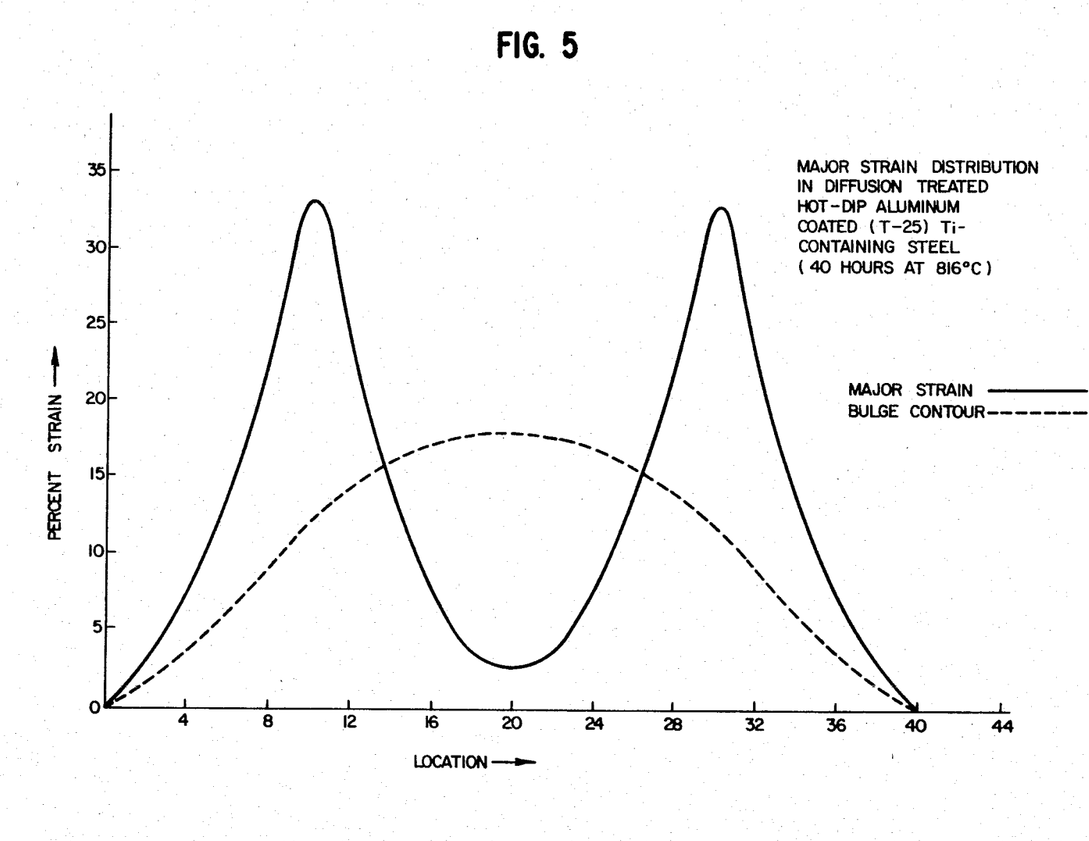
FIG. 5 is a strain diagram of the panel of FIG. 4 with a cross section of the bulge formed in the panel by the Bulge Tester superimposed thereon.

The improved high temperature oxidation resistance properties of a titanium containing aluminum killed low carbon steel strip which are provided by a solid solution iron-aluminum-silicon diffusion alloy coating having a surface concentration of about 10 wt. percent aluminum when prepared by the herein disclosed diffusion heating of a Type I aluminum hot-dip coating (i.e. aluminum-10 wt. % silicon) is shown in FIG. 4. The high temperature oxidation resistance of the iron-aluminum diffusion alloy coated steel of FIG. 4 is a marked improvement over the high temperature oxidation resistance of an identical steel strip having a Type I hot-dip metallic aluminum surface coating (See FIG. 1). In preparing the test panels of FIGS. 1 and 4 flat discs of each of the latter coated steels were subjected to severe straining in a Bulge Tester at room temperature by firmly clamping the edge portion of each disc around the periphery of a die cavity and pressing a rounded punch onto the center portion of each disc to form a bulge within the die cavity. The discs were deformed by stretching as the punch descended into the cavity. If the deformation is beyond the ability of the disc and coating to undergo uniform strain, the strain is localized and crazing or fractures results. The deformed iron-aluminum diffusion alloy coated disc (FIG. 4) and the hot-dip aluminum-silicon coated disc (FIG. 1) were then subjected to heating in an oxidizing atmosphere (i.e. air) at a temperature of 816° C. (1500° F.) for 500 and 420 hours, respectively. The deformed disc having the hot-dip metallic aluminum surface coating (FIG. 1) after oxidizing had very extensive oxidation damage over the entire area having more than about 5% strain, whereas the iron-aluminum diffusion alloy coated disc (FIG. 4) after oxidizing was slightly oxidized in the area of maximum stress where the strain was about 35 percent strain. A strain diagram of the diffusion coated panel of FIG. 4 as deformed in the Bulge Tester is shown in FIG. 5. The conformation of the bulge is represented by a dotted line in FIG. 5 to show the positions on the bulge corresponding to the strain measurements. The strain diagram for the aluminum coated deformed panel of FIG. 1 is substantially as in FIG. 5.

As an example, a solid solution iron-aluminum diffusion alloy coated steel strip was provided by applying via a Sendzimir-type coating line a hot-dip aluminum Type I coating (i.e. an alloy of metallic aluminum with about 11 wt. percent metallic silicon) having a thickness of about 20 μm (0.8 mil) on a low titanium alloy aluminum killed low carbon cold rolled steel strip having the following approximate composition:

|  | Wt. Percent |
|---|---|
| Carbon | 0.04 |
| Manganese | 0.25 |
| Phosphorous | 0.015 |
| Sulfur | 0.018 |
| Silicon | 0.05 |
| Molybdenum | 0.05 |
| Aluminum | 0.05 |
| Titanium | 0.50 |
| Total residual of Cu, Ni, Sn, Cr | 0.20 |
| Iron | Balance |

The steel strip was pickled and cleaned in a conventional manner to remove scale, rust and surface contamination and continuously passed through a furnace containing an oxidizing atmosphere maintained at a temperature of about 1093° C.(2000° F.) to burn off any remaining contaminants and form a thin oxide surface coating. The oxide coated steel strip was passed continuously through a furnace containing a reducing atmosphere (80% nitrogen/20% hydrogen) wherein the oxide coating was reduced to a metallic surface free of non-metallic impurities and provided with a surface to which the aluminum hot-dip coating readily adheres. The clean steel strip was cooled in a reducing atmosphere (90% nitrogen/10% hydrogen) to about bath temperature and immersed in the aluminum-11 wt. percent silicon hot-dip coating bath having a temperature of about 704° C. (1300° F.). The hot-dip coating weight was controlled by impinging gas jets as the strip emerged from the coating pot to provide a uniform Type I aluminum coating having a thickness of about 20 μm (0.8 mil). The aluminum coated strip was diffusion heated in open coil form at a slow heat to 816° C. (1500° F.) and maintained at a temperature of 816° C. (1500° F.) for 40 hours in a non-oxidizing 95% nitrogen/5% hydrogen atmosphere. The diffusion alloy coated strip was slow cooled in a non-oxidizing atmosphere and the cooled strip was temper rolled.

Figure 6:
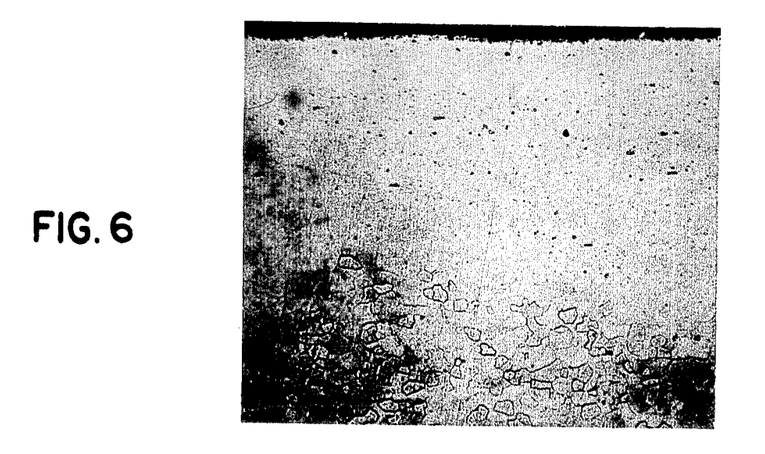
FIG. 6 is a photomicrograph of a cross-section of a steel strip having a solid solution iron-aluminum-silicon diffusion alloy surface coating (250× magnification and 4% nital etch) having a surface concentration of about 10 wt. percent aluminum made by diffusion heat treating a titanium containing aluminum killed low carbon steel strip with all the carbon combined with titanium and having a Type I aluminum hot-dip coating.

The solid solution iron-aluminum-silicon diffusion alloy coating produced in the foregoing manner had an aluminum surface concentration of about 10 wt. percent aluminum, 2 wt. percent silicon and was directly bonded to the titanium-containing low carbon steel strip with no subsurface intermetallic layer or other steel interface layer or inclusions in the solid solution diffusion alloy coating visible at 250× magnification (See FIG. 6). The diffusion alloy coated strip exhibited improved room temperature formability, had good high temperature oxidation resistance and coating adherence when the coated strip was exposed to an oxidizing atmosphere between 816° C. (1500° F.) and 982° C. (1800° F.) after being severely strained at room temperature, and exhibited good high temperature strength at 816° C. (1500° F.) for a prolonged period. The diffusion coated strip when exposed to nonaqueous environments in which aluminum coatings are conventionally resistant, such as in sulfidation and carburization environments, will also exhibit good corrosion resistance.

Figure 7:
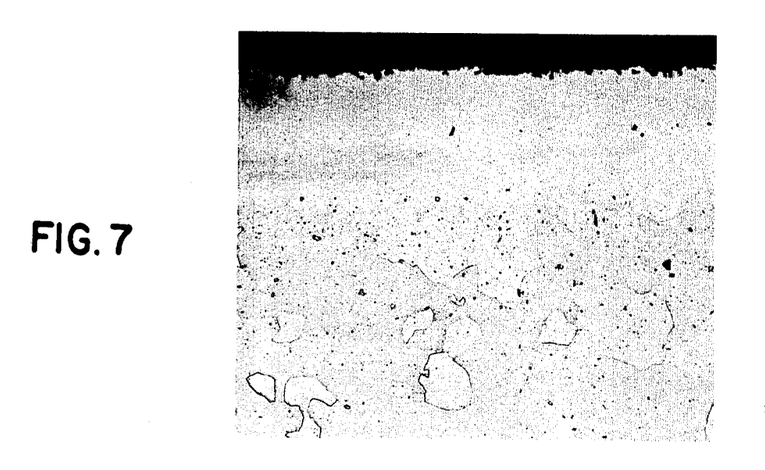
FIG. 7 is a photomicrograph of a cross-section of a steel strip having a solid solution iron-aluminum diffusion alloy surface coating (250× magnification and 4% nital etch) having a surface concentration of about 10 wt. percent aluminum made by diffusion heat treating a titanium-containing aluminum killed low carbon steel strip with all the carbon combined with titanium and having a Type II aluminum hot-dip coating.

As a further example, a hot-dip Type II aluminum coating (i.e. metallic aluminum without silicon) was formed on a steel strip having the same composition and diffusion heated in the same manner as in FIG. 6. The solid solution iron-aluminum diffusion alloy coating formed (See FIG. 7) had substantially the same microstructure and appearance as the iron-aluminum-silicon diffusion alloy coating of FIG. 6 and also exhibited the same improved room temperature formability and good high temperature oxidation resistance properties.

In the specification and claims the term "aluminum" or "aluminum coating", except where the context requires otherwise, comprises metallic aluminum and aluminum rich alloys containing small amounts of other metals, such as 5 to 12 wt. percent silicon or from 2 to 4 wt. percent iron, which do not significantly impair the room temperature formability properties and high temperature oxidation resistance characteristics of the diffusion alloy coated strip.

The terms low titanium alloy low carbon steel and titanium containing low carbon steel as used in the specification and claims designates a low carbon steel as defined herein having an amount of titanium at least 4 times the carbon content of the steel so that all the carbon in the steel is chemically combined with titanium and not in excess of about 1 wt. percent titanium.

While the foregoing discussion and specific embodiments have used a steel strip to illustrate the invention, it should be understood that the term "steel strip" as used in the specification and claims, is intended to include steel sheet and steel plate material and similar steel articles having an extensive flat surface area.

We claim:

1. A method of providing a hot-dip aluminum coated low carbon steel strip which has improved room temperature formability and good high temperature oxidation resistance after being severely deformed at room temperature comprising;

(a) applying on a continuous hot-dip coating line a hot-dip aluminum coating having a thickness range between about 8 μm (0.31 mil) and 37 μm (1.5 mil) selected from the group consisting of aluminum and aluminum-silicon alloy containing up to about 12 wt. percent silicon to a clean surface of a low-titanium alloy low carbon steel strip; and (b) heating said strip having said hot-dip aluminum coating in a diffusion heating zone containing a non-oxidizing atmosphere at a temperature of about 1500° F. and for a period of between 24–50 hours which avoids significantly increasing the grain size of the hot-dip coated steel strip and transforms the said hot-dip aluminum coating into a surface coating of solid solution diffusion alloy selected from the group consisting of iron-aluminum diffusion alloy and iron-aluminum-silicon diffusion alloy containing up to about 12 wt. percent silicon with a surface concentration between about 8 and about 10 wt. percent aluminum, and (c) said diffusion alloy coated steel strip characterized by having good resistance to oxidation at a temperature between 704° C. (1300° F.) and 982° C. (1800° F.) after being subjected to severe deformation at room temperature.

2. A method as in claim 1, wherein said steel strip is a cold rolled titanium containing aluminum killed low carbon steel strip having between 0.001 and about 0.25 wt. percent carbon, between about 0.02 and about 0.09 wt. percent aluminum, and between about 0.01 and about 1.0 wt. percent titanium.

3. A method as in claim 2, wherein said hot-dip coating is metallic aluminum.

4. A method as in claim 2, wherein the hot-dip coating is an aluminum-silicon alloy coating consisting essentially of aluminum and about 5 to about 12 wt. percent silicon.

5. A method as in claim 1, wherein said strip having a hot-dip coating between about 17 $\mu$m (0.7 mil) and 20 $\mu$m (0.8 mil) thick is heated in the form of an open coil in said diffusion heating zone at a temperature of about 816° C. (1500° F.) for a period of between about 24 and 50 hours.

6. A method as in claim 2, wherein said low carbon steel strip contains about 0.04 wt. percent carbon, about 0.5 wt. percent titanium and about 0.05 wt. percent aluminum, and said strip having a hot-dip coating thickness of between about 17 $\mu$m (0.7 mil) and about 20 $\mu$m (0.8 mil) is heated in said diffusion heating zone at a temperature of about 816° C. (1500° F.) for between about 30 and about 40 hours to provide a surface concentration of aluminum in said diffusion alloy coating of about 10 wt. percent aluminum.

* * * * *